United States Patent [19]
Brugger

[11] Patent Number: 5,665,999
[45] Date of Patent: Sep. 9, 1997

[54] METAL-SEMICONDUCTOR DIODE AND PROCESS FOR PREPARING METAL-SEMICONDUCTOR DIODES

[75] Inventor: Hans Brugger, Senden, Germany

[73] Assignee: Daimler Benz AG, Stuttgart, Germany

[21] Appl. No.: 564,312

[22] PCT Filed: Apr. 8, 1995

[86] PCT No.: PCT/EP95/01300

§ 371 Date: Nov. 5, 1995

§ 102(e) Date: Nov. 5, 1995

[87] PCT Pub. No.: WO95/28743

PCT Pub. Date: Oct. 26, 1995

[30] Foreign Application Priority Data

Apr. 14, 1994 [DE] Germany ............... 44 12 475.9

[51] Int. Cl.[6] ................................ H01L 29/47
[52] U.S. Cl. ............... 257/472; 257/623; 257/655; 257/12
[58] Field of Search ................ 257/472, 613, 257/623, 655, 657, 12

[56] References Cited

U.S. PATENT DOCUMENTS

| | | | |
|---|---|---|---|
| 4,301,233 | 11/1981 | Calviello | 257/472 |
| 4,382,265 | 5/1983 | Pearsau | 257/655 |
| 4,541,000 | 9/1985 | Colquhoun et al. | 257/623 |
| 4,568,958 | 2/1986 | Baliga | 257/332 |
| 4,855,796 | 8/1989 | Wong et al. | 257/472 |
| 4,916,716 | 4/1990 | Fenner et al. | 257/624 |
| 5,041,881 | 8/1991 | Bishop et al. | 257/472 |
| 5,084,409 | 1/1992 | Beam, III et al. | 437/80 |

FOREIGN PATENT DOCUMENTS

| | | | |
|---|---|---|---|
| 0018974 | 2/1978 | Japan | 257/472 |

OTHER PUBLICATIONS

Yoginder Anand et al., "Microwave Mixer and Detector Diodes", Proceedings of the IEEE, vol. 59, No. 8, Aug. 1971, pp. 1182–1190.

Stephen A. Maas 1993 no month Microwave Mixers Second Edition Artech House, Boston/London.

U.V. Bhapkar, T.A. Brennan, and R.J. Mattauch Feb. 1991 InGaAs Schottky Barrier Mixer Diodes for Minimum Conversion Loss and Low LO Power Requirements at Terahertz Frequencies *Second International Symposium on Space Terahertz Technology* .

K. Kajiyama, Y. Mizushima, and S. Sakata 1973 no month Schottky Barrier Height of n–$In_xGa_{1-x}$ As Diodes *Applied Physics Letter*.

Diane G. Garfield, R. J. Mattauch, and S. Weinreb Jan. 1, 1991 RF Performance of a Novel Planar Millimeter–Wave Diode Incorporating an Etched Surface Channel *IEEE Transactions on Microwave Theory and Techniques*, vol. 39.

B. Adelseck, A. Colquhoun, J.-M. Dieudonne, G. Ebert, D.E. Schmegner, W. Schwab, and J. Selders Dec. 1989 A Monolithic 60 GHz Diode Mixer and IF Amplifier in Compatible Technology *IEEE Transactions on Microwave Theory and Techniques*, vol. 37, No. 12, Dec. 1989.

Jean–Marie Dieudonné, Bernd Adelseck, Karl–Ernst Schmegner, Rainer Rittmeyer, Alexander Colquhoun Jul. 1992 Technology Related Design of Monolithic Millimeter–Wave Schottky Diode Mixers *IEEE Transactions on Microwave Theory and Techniques*, vol. 40, No. 7.

*Primary Examiner*—Sara W. Crane
*Assistant Examiner*—David B. Hardy
*Attorney, Agent, or Firm*—McGlew and Tuttle

[57] ABSTRACT

It is suggested for a metal-semiconductor diode that the depletion zone layer be grown epitaxially from deformed $In_xGa_{1-x}As$ with an indium content x increasing in the direction of the metal contact and/or that a diode area be delimited by surrounding insulation regions in a planar design consisting of a flat layer sequence and that the metal contact be provided on the surface of the layer sequence. Corresponding advantageous manufacturing processes are described.

15 Claims, 14 Drawing Sheets

METAL-SEMICONDUCTOR DIODE AND PROCESS FOR PREPARING METAL-SEMICONDUCTOR DIODES

FIELD OF THE INVENTION

Rectifying, majority carrier-predominated metal-semiconductor diodes (so-called Schottky diodes) are used in the form of individual components or in the form of monolithically integrated circuits (so-called MMICs) for mixers and detectors in sensor, communications and radar systems used at extremely high frequencies. Metal-semiconductor diodes from the III/V material gallium arsenide (GaAs) are used for this purpose almost exclusively due to the fact that their electronic properties are more favorable for these applications. Furthermore, the resistive (so-called semi-insulating) GaAs substrate is favorable for the integration technique in the high-frequency range for manufacturing technical reasons, and it is therefore preferably employed.

BACKGROUND OF THE INVENTION

The highest sensitivities ever have been reached and maximum frequencies up into the terahertz range are attained with such diodes. The relatively high cutoff voltage of the diodes in the forward direction, which is typically in the range of 0.7 V to 0.8 V due to electronic surface states in the GaAs, is a disadvantage of these components. To reach sufficient performance capacity for mixer applications in terms of conversion loss, pumping capacity, sensitivity and noise behavior, such diodes are therefore operated with bias voltages (e.g., S. A. Maas: *Microwave Mixers*, 2nd edition, Artec House, Boston, 1993).

However, operation with a bias voltage leads to disturbances known as Townsend current hum. On the other hand, operation without bias voltage requires a high pumping capacity of the local oscillator (LO) to reach a low conversion loss.

It has been known from theoretical calculations from U. V. Bhapkar, T. A. Brennan and R. J. Mattauch: InGaAs Schottky Barrier Mixer Diodes for Minimum Conversion Loss and Low LO Power Requirements at Terahertz Frequencies, Proceedings of the 2nd international Symposium on Space Terahertz Technology, Feb. 1991, pp. 371–388, that a marked reduction in the necessary LO power for pumping the mixer diode can be expected from Schottky diodes with reduced electron release barriers at InGaAs depletion zone layers compared with GaAs depletion zone layers at comparable conversion losses. In addition, structures consisting of InGaAs layers with constant In content (20% or 30%) and experimental results were already mentioned in the above-mentioned publication. To obtain acceptable depletion zone lengths, layer thicknesses between 80 nm and 150 nm were prepared. However, these thicknesses are far greater than the corresponding critical layer thicknesses, so that the regions are already partially relaxed. Such structures contain a large number of dislocation lines and crystal defects, which exert a highly unfavorable effect on the electronic behavior of the diode as well as on the reliability and the quality of the component.

Even though it is possible, in principle, to prepare non-relaxed InGaAs layers on GaAs with high In content by drastically reducing the InGaAs layer thickness to values markedly below the critical layer thickness (e.g., below a thickness of less than 5 nm for an In concentration of 30%), this leads to an appreciable reduction of the electron barrier, because the conduction band jump between InGaAs and GaAs is very close to the Schottky contact and the edge of the conduction band of the GaAs material represents the effective barrier height for the current transport. Such a component consequently behaves like a diode with a GaAs depletion zone layer.

It has been known from K. Kajiyama, Y. Mizushima, and S. Sakata: Schottky Barrier Height of n-InxGa1-xAs Diodes, *Applied Physics Letters*, Vol. 23, No. 8, pp. 458–459, 1973, that the electron release barrier in InGaAs material continuously decreases with increasing In content, beginning from pure GaAs material, and there is no barrier any more for pure InAs material. It has been well known that the lattice constant increases nearly linearly with increasing In content, which leads to a corresponding mismatch between InGaAs and GaAs. Electronic band jumps are formed at the interface of lattice-adapted and deformed (compression) InGaAs and GaAs, such that the conduction band in InGaAs is lower and the valence band is higher than in GaAs. It has also been known that the energy gap of elastically deformed InGaAs on GaAs decreases nonlinearly with increasing In content.

Other critical parameters of such diodes, especially in mixer arrangements, are the so-called cutoff frequency (fco), the ideality factor (n), and the noise factor of the component. These variables depend mainly on the nonlinear conductivity and the limiting, loss-containing equivalent circuit variables, namely, the series resistance (Rs), the junction capacitance (CjO), and the parasitic stray capacitance (Cpar), which should be minimized on the whole, and the relationship $fco = [2\pi Rs*(CjO+Cpar)]^{-1}$ is valid.

An arrangement and a process for preparing planar millimeter-wave diodes has been known from D. G. Garfield, R. J. Mattauch, and S. Weinreb: RF Performance of a Novel Planar Millimeter-Wave Diode Incorporating an Etched Surface Channel, *IEEE Transactions on Microwave Theory and Techniques*, Vol. 39, No. 1, pp. 1–5, 1991. The structure is based on a GaAs material layer sequence with relatively thick epitaxial layers. To reduce the parasitic capacitances, the authors use an etched channel structure and an air bridge lead for the Schottky metalization. Good CjO and Rs values can thus be reached, but the process steps are technologically complicated, and the structure also has the disadvantage that the parasitic coupling capacitance as a dominant component in Cpar between the Schottky metalization line and the conductive semiconductor layers separated via a dielectric layer is high. The arrangement is also unsuitable for the preparation of planar components.

An arrangement and a process for preparing planar Schottky mixer diodes has been known from B. Adelseck, A. Colquhoun, J. -M. Dieudonne, G. Ebert, D. -E. Schmegner, W. Schwab, and J. Selders: A Monolithic 60 GHz Diode Mixer and IF Amplifier in Compatible Technology, *IEEE Transactions and MicroWave Theory and Techniques*, Vol. 37, pp. 2142–2147, 1989. The component is prepared according to a MESFET technology by using the following process steps: Silicon implantation, high-temperature healing, epitaxial overgrowth, insulation implantation, and electron-beam lithography. The Schottky metal contact is sunk via a "recess" channel into the depletion zone layer, which is located buffed under a highly doped contact layer. Published limit frequencies of fco<1.5 THz and cutoff voltages between 0.7 V and 0.8 V were reached (J. M. Dieudonne, B. Adelseck, E. E. Schmegner, R. Rittmeyer, and A. Colquhoun: Technology Related Design of Monolithic Millimeter-Wave Schottky Diode Mixers, *IEEE Transactions and Microwave Theory and Techniques*, Vol. 40, pp. 1466–1474, 1992). This process does not make it possible to prepare diodes with reduced cutoff voltages and to reach very low Rs values with simultaneously low CjO values, because the conductivity of the ohmic lead layer prepared by silicon implantation is limited, the current must flow through the low-doped depletion zone layer (PET arrangement), and the Schottky metal contact resistance already increases markedly in these small structure geometries (<0.3 μm) and it dominantly determines Rs.

SUMMARY AND OBJECTS OF THE INVENTION

The object of the present invention is to provide a metal-semiconductor diode possessing advantageous properties especially for operation in high-frequency mixing arrangements, as well as a simple and inexpensive process for preparing metal-semiconductor diodes.

According to the invention, a metal-semiconductor diode is provided with a metal contact on a depletion zone from deformed $In_xGa_{1-x}As$. The indium content (x) within the depletion zone continuously increases in the direction of the metal contact.

The change in the indium content preferably follows a higher-order function. The depletion zone is preferably grown on a high-doped GaAs lead layer in a latas-adapted manner. The depletion zone layer preferably has a doping profile with locus-dependent concentration course.

The $In_xGa_{1-x}As$ depletion zone layer is preferably grown on a high-doped lead layer in a uniform epitaxial step. The indium content increases over the course of time.

The invention preferably provides a metal-semiconductor diode in planer arrangement with a high-doped lead layer, a depletion zone layer deposited thereon, an insulation region surrounding the diode and reaching through the lead layer and the depletion zone layer, a metal contact arranged on the surface of the depletion layer and openings with connection contacts reaching through the depletion zone layer into the lead layer. Insulation regions are preferably provided laterally with respect to the metal contact at the boundary between the depletion layer and the openings.

The invention further preferably provides a process for preparing a metal-semiconductor diode including the steps of growing the depletion zone layer on a high-doped lead layer, preparing insulation regions surrounding an intended diode area through the depletion zone layer and the lead layer by means of an implantation process, preparing a diode-metal contact on the depletion zone layer in the diode area and preparing leads via the insulation regions, and preparing channels for contacting the lead layer through the depletion zone layer in the diode area. The insulation region surrounding the diode-metal contact are preferably prepared in the depletion zone layer by using the diode-metal contact by means of an implantation process. An etching stopping layer or a passivating layer is preferably additionally deposited on the depletion zone layer.

The metal-semiconductor diodes according to the present invention are planar and can be monolithically integrated. Compared with diodes with a GaAs depletion zone layer, they have reduced cutoff voltage in the forward direction. This makes possible operation in mixer arrangements without bias voltage with markedly reduced oscillator output. In addition, the deformation of the depletion zone layer leads to a more favorable breakdown voltage characteristic in the inverse direction.

It is important in this connection for, the indium concentration within the InGaAs depletion zone layer to increase continuously, preferably according to a high-order function, in the direction of the epitaxial surface toward the Schottky metal contact beginning from; the high-doped ohmic lead layer, and for the layer as a whole to be elastically deformed. It is especially advantageous for the preparation of the entire vertical layer structure to be able to be performed in a continuous process step by means of an epitaxial process.

It is also advantageous that a planar component structure having especially favorable properties is formed due to the arrangement of the Schottky metal contact on the epitaxial surface. The properties of such a diode are also advantageously affected by the fact that the depletion zone region is located within a flat mesa structure and the ohmic metal contact is lowered on the high-doped lead layer located under the depletion zone layer. It is possible as a result to obtain low series resistances and low capacitances in the diodes at the same time. The metalization paths for the anode and cathode connections extend on the semiconductor surface outside the area of the component, and the originally conductive epitaxial layers outside the component are insulated by a selective implantation.

The process according to the present invention makes it possible to prepare vertically layered diodes by using only
  one epitaxial step for depositing the layer,
  one implantation step to insulate the regions located outside the component, and
  a conventional, optical contact lithographic technique for structuring (photolithography, stepper technology).

Structure dimensions of Schottky metal contacts in the range of 0.5 μm to 1 μm can thus be obtained in a technologically simple manner and planar metal-semiconductor diodes with fco values between 2 THz and 3 THz with simultaneously reduced cutoff voltages can be prepared. For example, tehnologically complicated process steps, such as air bridge techniques, channel etching and "recess" processes, epitaxial overgrowth steps, high-temperature healing, and electron-beam exposure techniques, are avoided.

The combination of the features of the depletion zone layer with increasing indium content and the planar structure with surrounding insulation regions and Schottky metal contact located at the surface as well as the manufacturing processes associated therewith are especially advantageous.

The metal-semiconductor diodes according to the present invention and the processes for preparing same offer especially the following advantages:
  Simple and inexpensive technological process for preparing the components,
  reduction in the parasitic variables,
  low electron release barrier and reduced cutoff voltage in the forward direction (high In concentration at the metal contact),
  improvement in the ideality factor of the diode,
  high critical layer thickness of the InGaAs depletion zone layer,
  low series resistance (high charge carrier mobility and no abrupt heterointerface in the depletion zone, highly conductive lead layers),
  great biaxial deformation in the are of high electrical field with more favorable breakdown voltage characteristic in the inverse direction (reduction in the rate of collision ionization),
  insulating regions outside the component area, so that planar arrangements can be prepared and the monolithic integration of additional components by heteroepitaxy or epitaxial overgrowth, e.g., of MESFET, HFET, LO, and HF power-generating components, etc., are possible.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
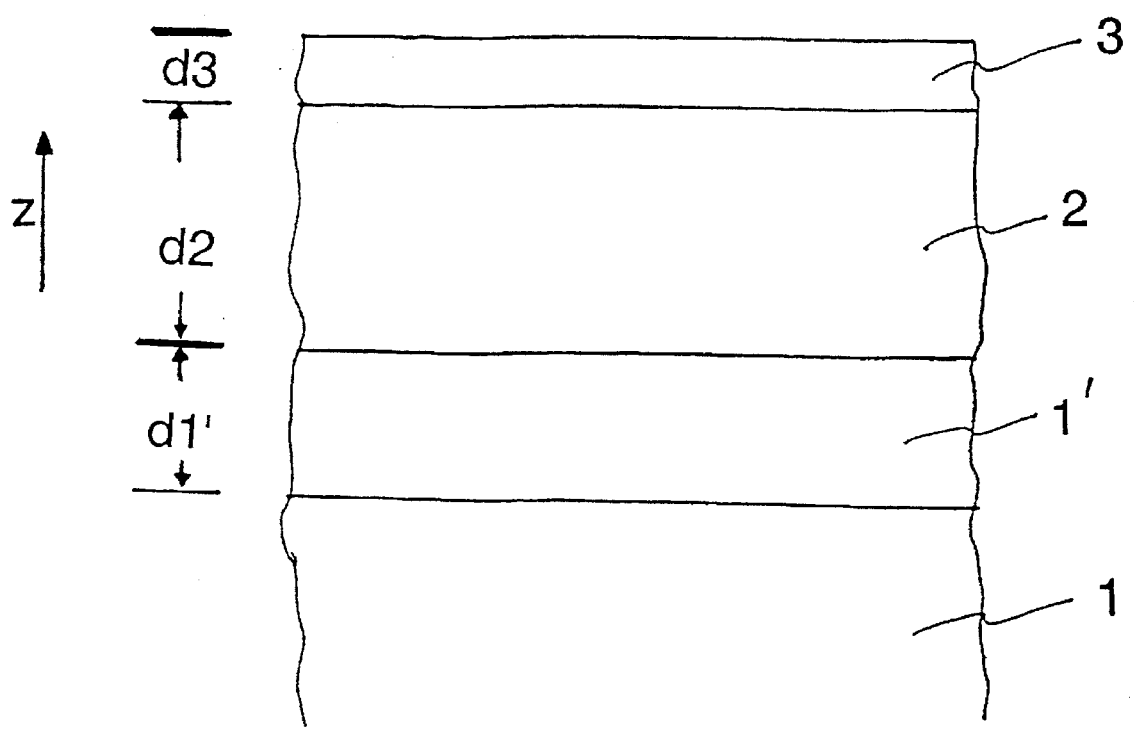
FIG. 1 is a schematic view showing the vertical layer structure and doping profile in the z direction (at right angles to the planes of the epitaxial layers)
Figure 2:
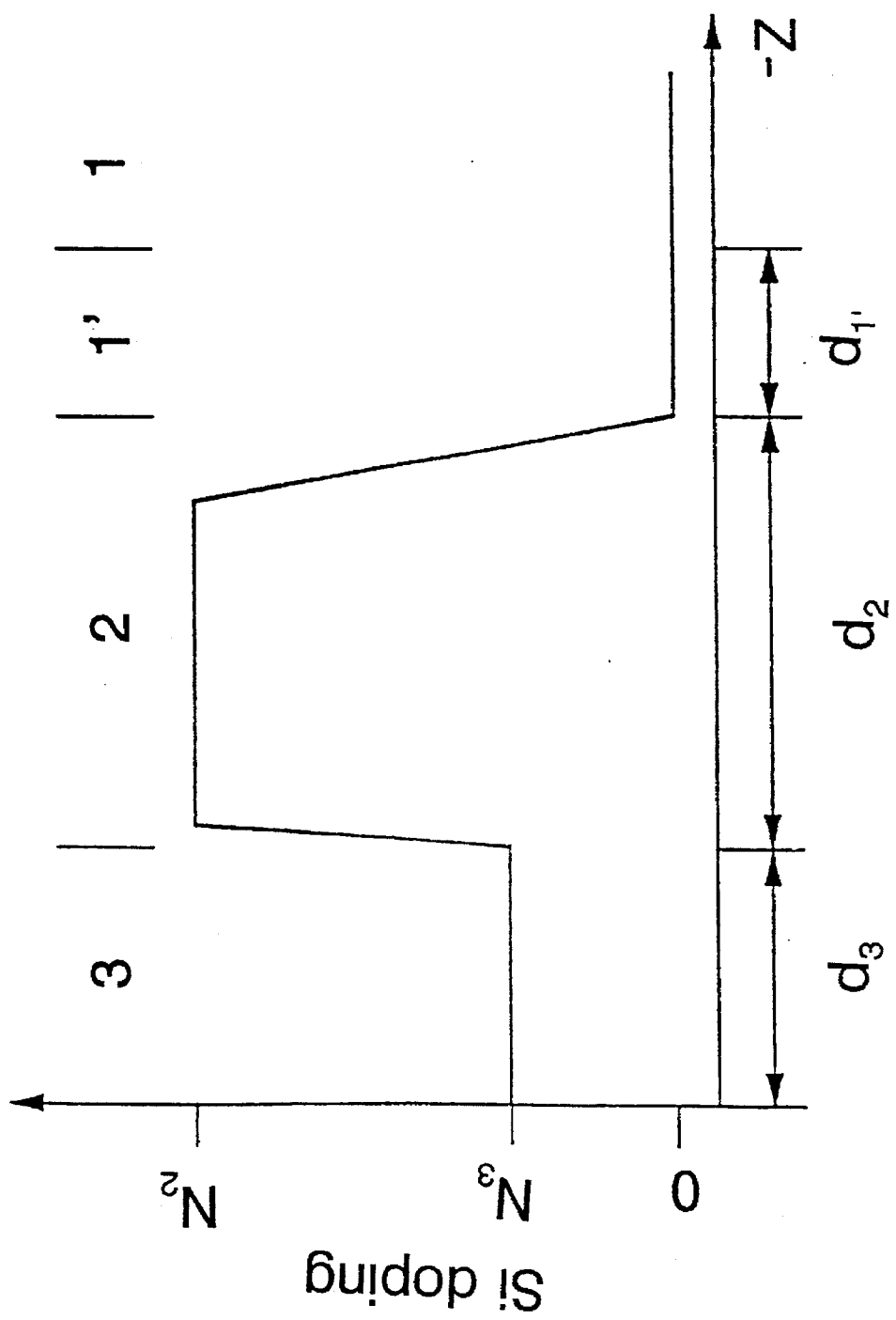
FIG. 2 is a diagram showing the vertical layer structure and doping profile in the z direction.

FIG. 1 and FIG. 2 schematically show the vertical layer structure and the doping profile in the z direction (at right angles to the planes of the epitaxial layers). An undoped, semi-insulating GaAs disk 1 is used as the substrate. The individual semiconductor layers 1', 2 and 3 are deposited one after another in one process step by means of an epitaxial method, preferably molecular beam epitaxy:

An undoped buffer layer 1', preferably from GaAs material and an AlGaAs/GaAs superlattice structure with an overall thickness if, e.g., d1' in the range of 0.1 µm and 0.5 µm, a high-doped ohmic n++ lead layer 2 from GaAs material, preferably with a thickness d2 in the range of 0.4 µm to 0.8 µm and with a doping agent concentration N2 between $5 \times 10^{18}$ cm$^{-3}$ and $1 \times 10^{19}$ cm$^{-3}$, preferably with silicon, for preparing a low-ohmic layer with a layer resistance of typically less than 10Ω/sq.

A low-doped and indium-containing $In_xGa_{1-x}As$ depletion zone layer 3, preferably with a thickness d3 in the range of 50 nm to 100 nm and with a constant doping agent concentration N3 in the range of $10^{16}$ cm$^{-3}$ to $10^{17}$ cm$^{-3}$, preferably with silicon. An alternative advantageous embodiment provides for a doping agent profile decreasing or increasing continuously over the thickness d3 to the metal contact within the depletion zone layer 3, beginning, e.g., from $10^{17}$ cm$^{-3}$ to $10^6$ cm$^{-3}$ on the epitaxial surface, instead of a constant doping agent concentration N3.

Figure 3:
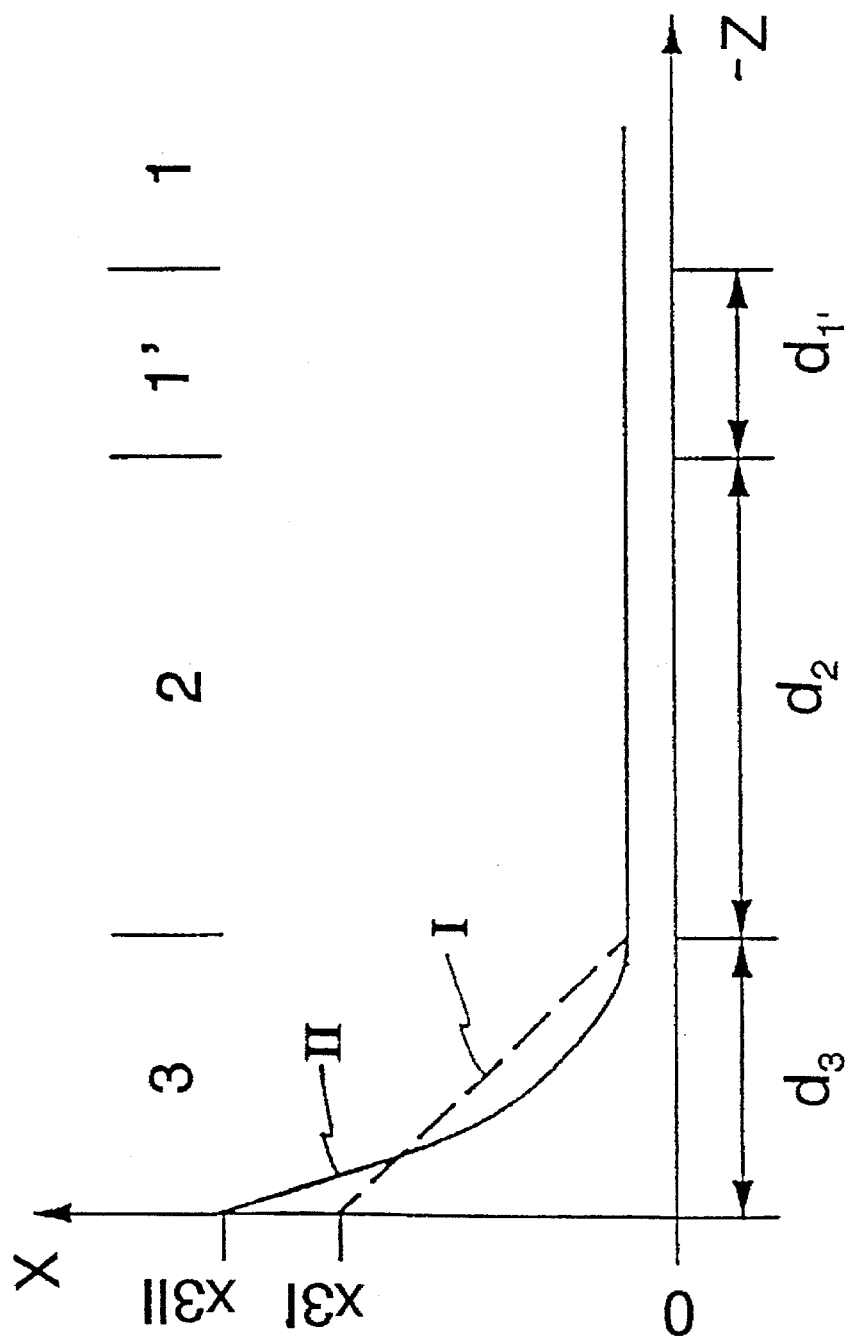
FIG. 3 is a diagram showing the In concentration profile of two exemplary layer structures.

The concentration profile of the indium-containing $In_xGa_{1-x}As$ depletion zone layer 3 in the advantageous arrangement according to the present invention is preferably selected to be such that the In concentration increases continuously within the depletion zone layer 3, i.e., it is a function of the space coordinate z (x=f(z)). The In concentration profile of two exemplary layer structures is shown in FIG. 3. Curve I, drawn in broken line, shows a linearly increasing In profile with a maximum In content of x3=xeI on the epitaxial surface. Curve II, drawn in solid line, shows an example of a preferably nonlinear In profile following the course of a higher-order function with an In concentration increasing, e.g., according to the second power in the direction of the surface. The maximum possible critical In concentration x3=x3II at the surface can be selected to be considerably higher in this case than x3I in the case of the linear profile or in that of a constant profile (x=const.). As a result, it possible to obtain markedly reduced cutoff voltages and more favorable bulk resistances.

The In content x in layer 3 preferably begins at x=0. Not only is an advantageous course of the deformation in layer 3 achieved, but an additive resistance component in current transport, which appears in the case of an abrupt GaAs/InGaAs heterointerface and is disadvantageous for the component, is also avoided due to the gradual and continuously increasing In content.

The critical layer thickness of the elastically deformed depletion zone layer 3 is reached when the elastic energy stored by the biaxial compression exceeds a critical value, namely, the threshold energy, beyond which the crystal is relaxed due to the formation of dislocation lines. This threshold energy is essentially proportional to the second power of the deformation and is a linear function of the layer thickness d3, wherein the elastic deformation is defined via the difference of the lattice constants of the InGaAs layer and the GaAs substrate. It may be assumed in a good approximation that the lattice constant of InGaAs increases linearly with increasing In content. The maximum thickness which the elastically deformed InGaAs depletion zone layer can reach for different In concentration profiles x(z) before the crystal is relaxed, and consequently the possible value of the maximum In concentration on the epitaxial surface, which determines the formation of the electron release barrier and hence the cutoff voltage of the metal-semiconductor diode, can be estimated in the well-known manner.

Figure 4:
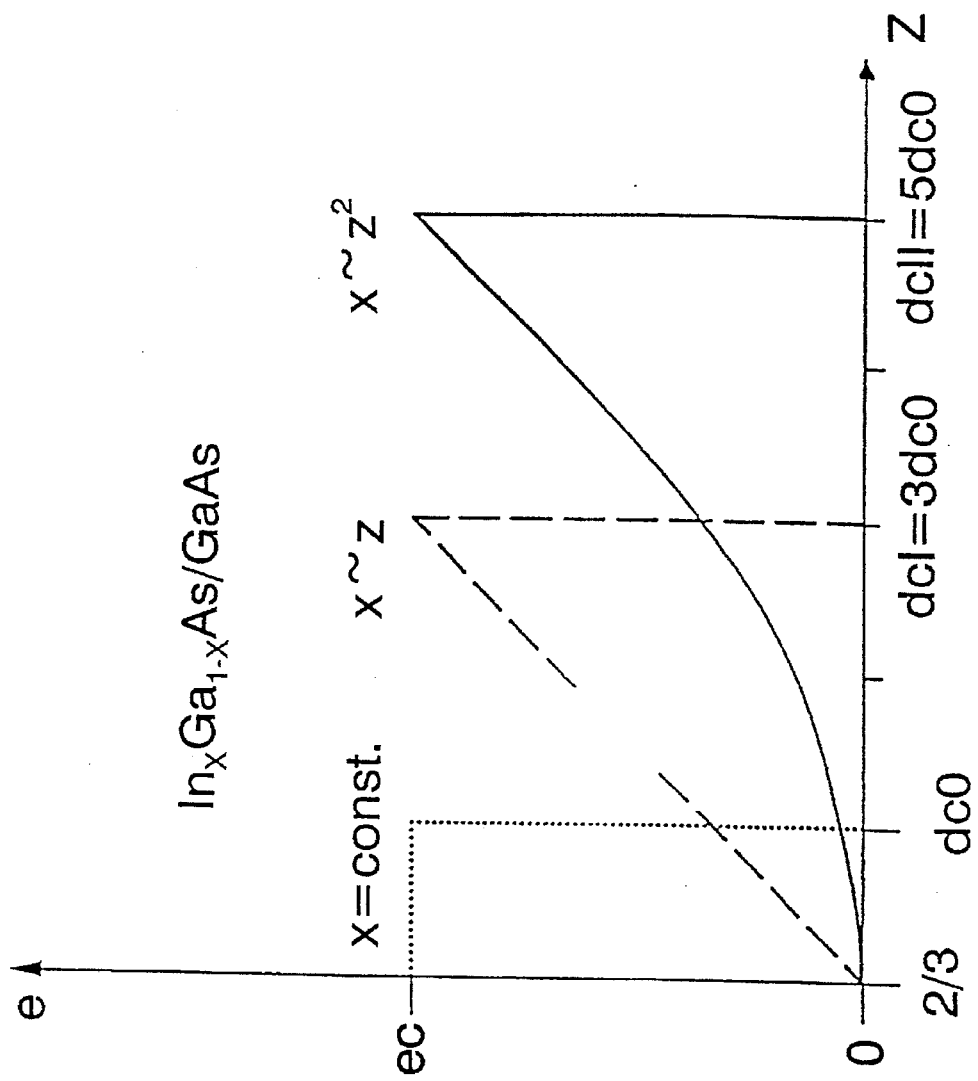
FIG. 4 is a diagram showing exemplary deformation profiles for In contents x(z) which are constant or increased linearly or increased according to the second power as deformation e(z) and a maximum layer thickness.

FIG. 4 shows exemplary deformation profiles for In contents x(z) which are constant or increase linearly or according to the second power as deformation e(z) and their maximum layer thicknesses. The actual maximum layer thickness for the depletion zone layer can be derived for different In profiles from a desired, maximum In concentration x3 on the epitaxial surface, which corresponds to a deformation value ec. It is found that, beginning from a critical layer thickness dc0 for a constant profile (x=const.), an approximately 3 times greater layer thickness dcI=3dc0 can be obtained in the case of linearly increasing In content, and a 5 times greater layer thickness dcII=5dc0 can be obtained for a preferred In profile with a quadratic locus dependence.

A markedly thicker, elastically deformed layer with a high In concentration at the surface is obtained due to the locus-dependent In concentration increasing in the direction of the surface, while a conduction band jump near the epitaxial surface is avoided. The electron release barrier and consequently the diode cutoff voltage can be markedly reduced as a result, an abrupt heterostructure transition from GaAs to InGaAs near the surface is at the same time avoided, and the electron mobility is higher within the depletion zone layer than in GaAs. This has a highly advantageous effect on the bulk resistance, which forms a component of the diode series resistance. This advantage can also be used to further reduce the doping concentration N3 in the depletion zone layer 3 or to incorporate a locus-dependent doping profile instead of a constant doping concentration, which may have an advantageous effect on the behavior of the component, depending on the particular application, e.g., the preparation of an MOTT diode with weak dependence of the junction capacitance on the working point. The table below shows the maximum In concentrations x3 at the epitaxial surface to the Schottky metal contact, which are decisive for the reduction in the cutoff voltage, for an exemplary depletion zone layer thickness d3 of 80 nm for the different In profiles. It is seen that a more than twice as high In concentration and thus a markedly reduced cutoff voltage can be obtained with an advantageous, quadratic In concentration dependence. This effect can be increased further for an In concentration profile according to a function of even higher order.

| In concentration profile | Maximum In content x3 (%) |
|---|---|
| constant, $x = $ const. | 10.0 |
| linear, $x \sim z$ | 17.3 |
| quadratic, $x \sim z^2$ | 22.4 |

Figure 5:
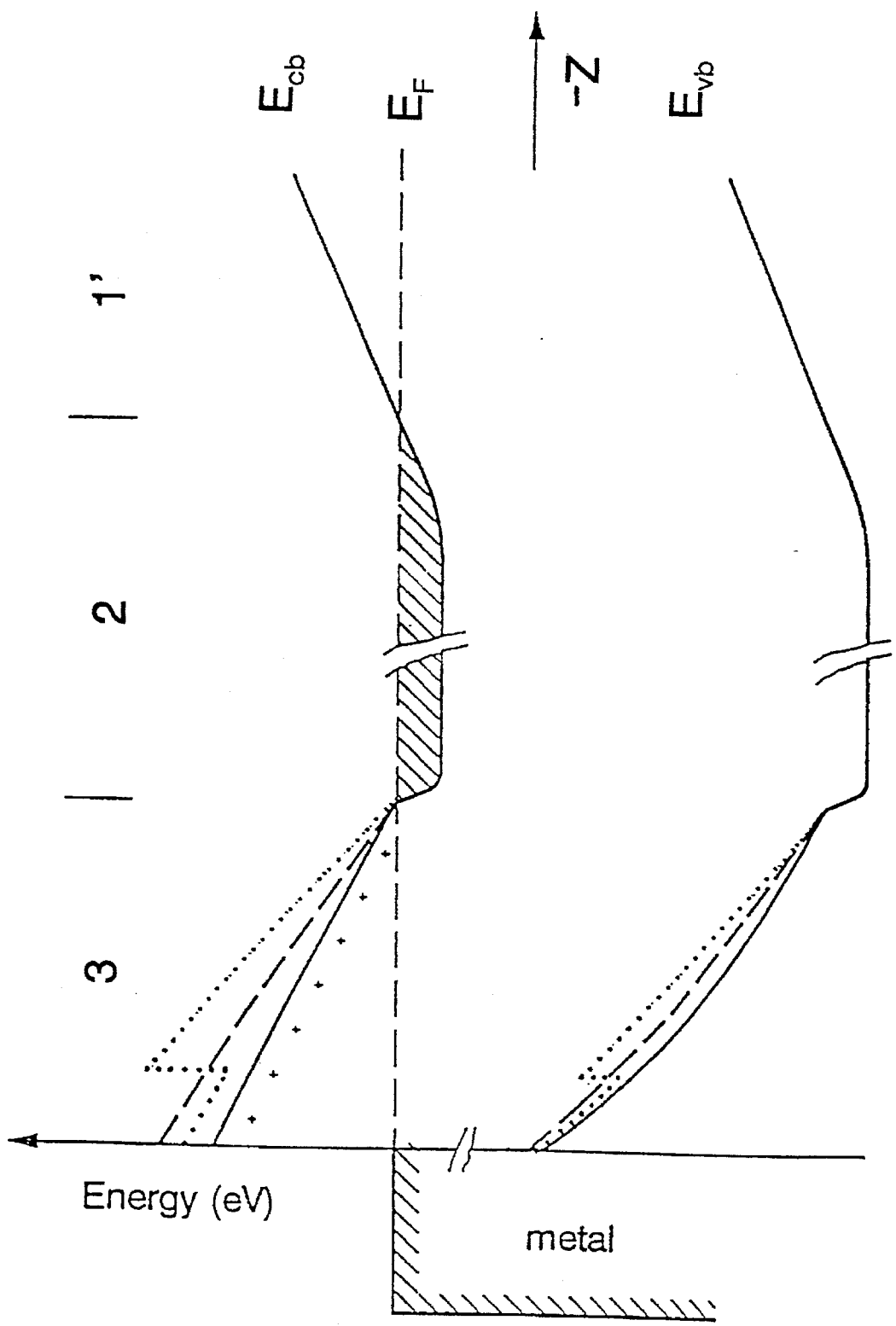
FIG. 5 is a diagram schematically showing the course of the electronic conduction band (Ecb) and the valance band (Evb) without external voltage applied (firmy energy E=const.) within the metal-semiconductor diode structure in the z direction, as an example each of a constant In profile, of a linear In profile, and of a quadratic In profile, using the types of line corresponding to FIG. 4.

FIG. 5 schematically shows the course of the electronic conduction band (Ecb) and of the valence band (Evb) without external voltage applied (Fermi energy EF=const.) within the metal-semiconductor diode structure in the z direction, as an example each of a constant In profile, of a linear In profile, and of a quadratic In profile, always using the types of line corresponding to FIG. 4. The doping concentration N3 is advantageously selected to be so low that the depletion zone being formed reaches the high-doped, ohmic lead layer 2 (so-called MOTT design), which also has a favorable effect on the necessary LO power balance, besides the reduction in the cutoff voltage. It can also be recognized from FIG. 5 that a conduction band jump, which predominantly compensates the effective reduction in the electron barrier by InGaAs and also has an unfavorable effect on the series resistance, is formed near the surface when a simple InGaAs layer with constant In content is used. The valence bands show a more pronounced bending because of the nonlinear dependence of the energy gap on the In content.

Figure 6A:
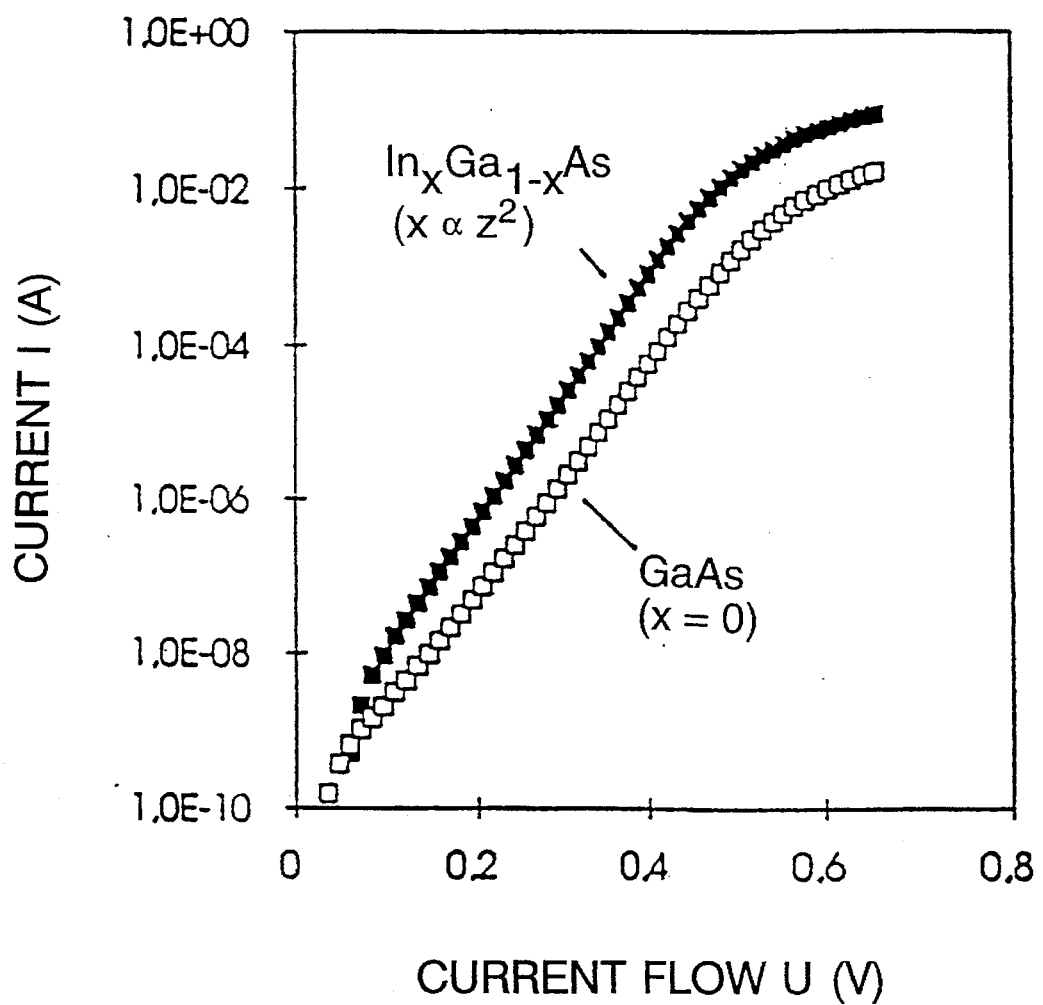
FIG. 6a is a diagram showing measured current-voltage characteristics of a large area metal-semiconductor diode InGaAs depletion zone layer.
Figure 6B:
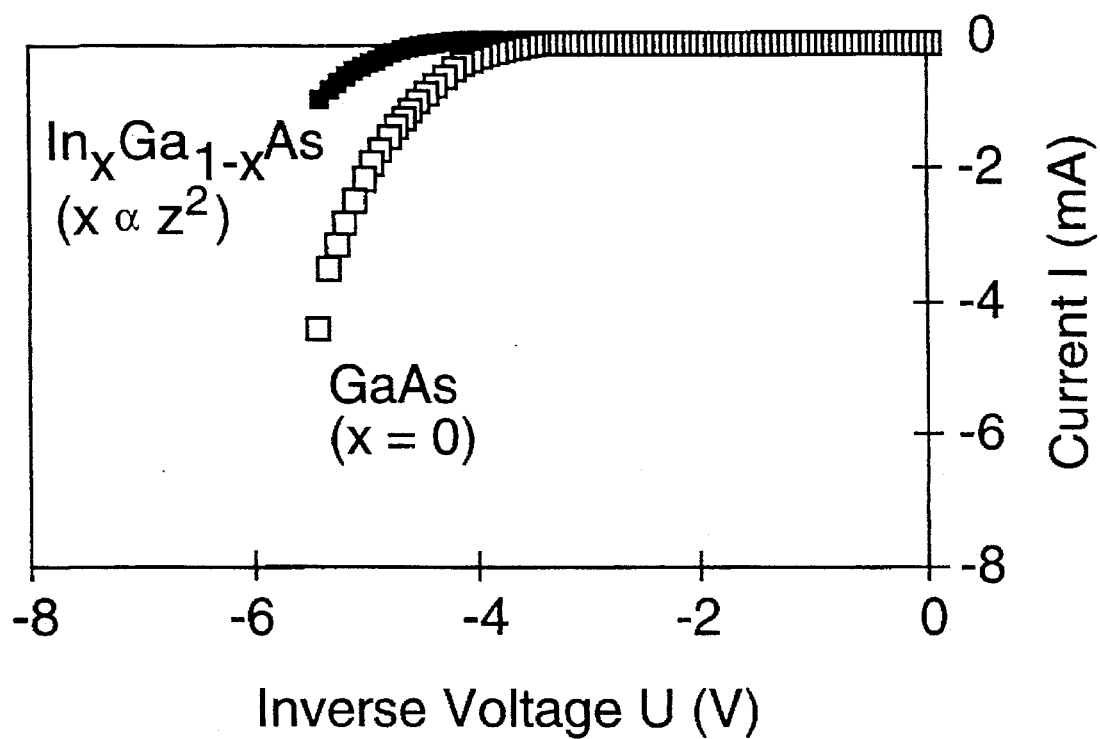
FIG. 6b shows measured current-voltage characteristics (measured curves) showing that the doping concentration in the depletion zone layer, N3, can be further reduced.

FIG. 6a shows the measured current-voltage characteristic of a large-area metal-semiconductor diode (2,000 µm²) with an InGaAs depletion zone layer of the thickness d3=100 nm and a doping concentration of N3=1×10$^{17}$ cm$^{-3}$. The In concentration profile is designed, corresponding to the advantageous embodiment, according to a nominally quadratic locus dependence. The maximum In concentration at the epitaxial surface is x3II =20%. The measurement points are represented by solid squares. A corresponding reference sample with a GaAs depletion zone layer with a doping concentration of N3=3×10$^{17}$ cm$^{-1}$ is indicated by blank squares for comparison. The metal-semiconductor diode with InGaAs composition profile displays markedly higher current values over a broad voltage range, and the rise of the current-voltage curve, which is an indicator of the ideality factor n, is steeper over a broad current range than in the reference diode with GaAs depletion zone layer. The measured value of n=1.04 is markedly lower than in the reference sample with n=1.15. The diode begins to drive hard and the I(U) curve becomes flat because of the finite series resistance especially in the range of U>0.5 V. High current values (15 mA) are already reached in the conduction range at voltage values that are lower by about 0.2 V than in the case of the reference diode. These improved transport properties of the component arrangement according to the present invention are a consequence of the special In concentration profile. Furthermore, it is advantageous in such diode arrangements that the doping concentration in the depletion zone layer, N3, can be further reduced due to the improved electronic properties (especially bulk resistance), which is also manifested by an improved breakthrough characteristic in the inverse direction. This is shown in FIG. 6b on the basis of the measured curves.

Figure 7:
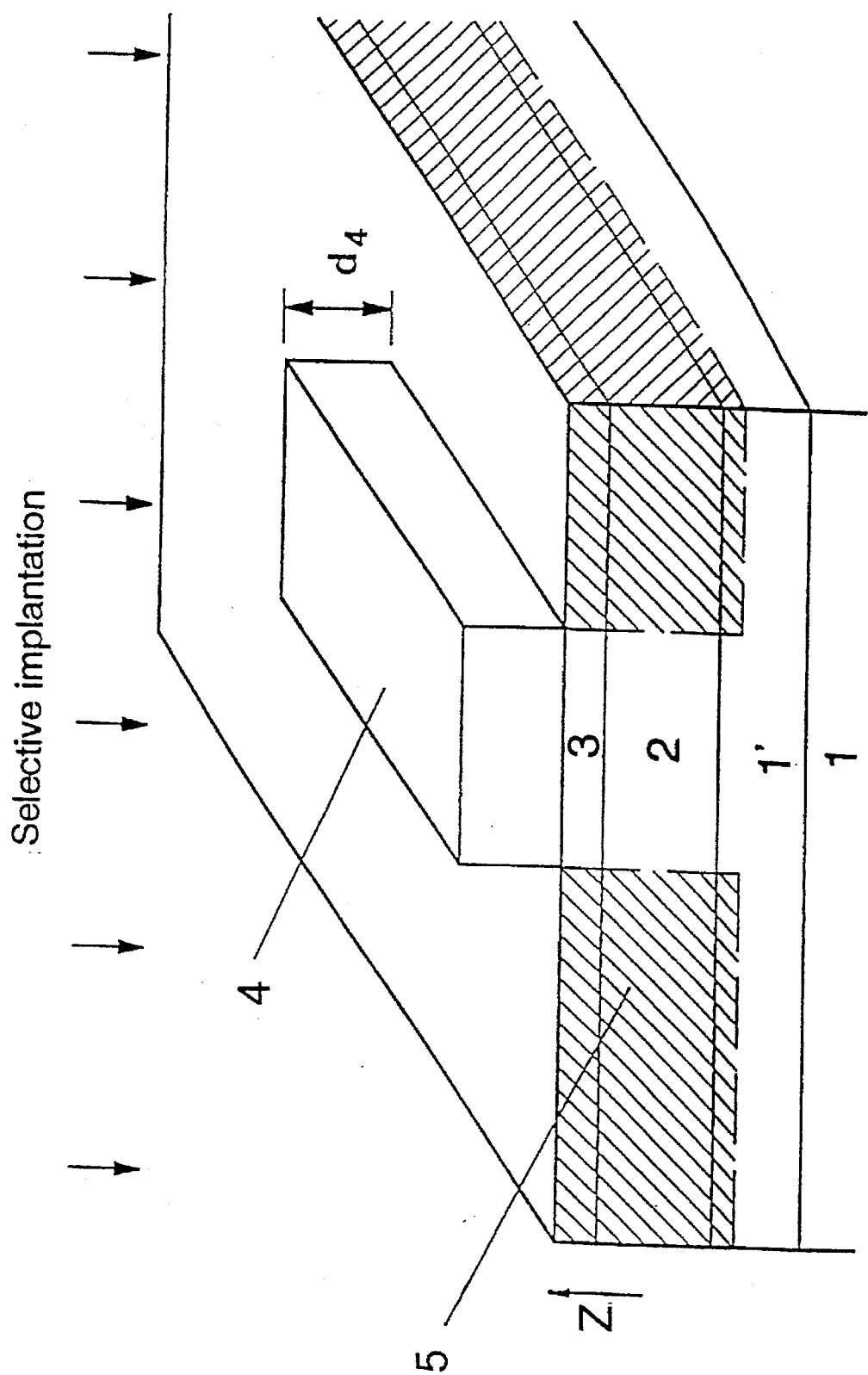
FIG. 7 is a schematic perspective view of a semiconductor disk prepared according to an epiaxial process according to the invention.

A simple manufacturing process is proposed for preparing planar metal-semiconductor diodes which can be integrated. FIG. 7 shows a perspective view of the semiconductor disk prepared according to an epitaxial process, preferably by molecular-beam epitaxy, wherein only the layers 2 and 3 are doped and are conductive among the layers epitaxially deposited on the semi-insulating GaAs substrate 1 (of FIG. 1). To prepare a completely planar structure, all conductive regions outside the area intended for the metal-semiconductor diode are again insulated according to an implantation process, advantageously with boron or oxygen ions. The laterally selective insulation process is normally based on a charge carrier capture by the defects generated in the semiconductor crystal during the implantation.

The epitaxial disk is advantageously covered locally with a dielectric layer 4 for this purpose. For example, a deposited SiO$_2$ layer is used for this; its thickness is selected to be such that it completely absorbs the ions appearing during the implantation process. A thickness of d4<2 µm is sufficient for this for, e.g., a layer thickness of d2+d3=0.7 µm to be implanted. This dielectric cap 4 in FIG. 7 is structured by photolithographic processes and a subsequent etching process, advantageously according to a dry chemical technique.

The implantation is advantageously carried out with boron ions, and the energies and the doses are adjusted to the regions to be insulated and to the doping concentrations in the layers 2 and 3. A total of 2 to 3 different ion energies are sufficient for this for a layer thickness of, e.g., d2+d3=0.7 µm to be implanted with the doping concentrations proposed in the exemplary embodiment. If boron ions are used, maximum energies of up to 320 keV are sufficient for ions carrying one charge (B+) with an overall dose of typically <3×10$^{13}$ cm$^{-2}$, e.g., 320 keV (2×10$^{13}$ cm$^{-2}$), 160 keV (6×10$^{12}$ cm$^{-2}$), and 80 keV (2×10$^{12}$ cm$^{-2}$). If oxygen ions are used, maximum energies of typically up to 450 keV are sufficient for ions carrying one charge (0+) with an overall dose of typically $<2 \times 10^{13}$ cm$^{-2}$, e.g., 450 keV ($1 \times 10^{13}$ cm$^{-2}$), 220 keV ($3 \times 10^{12}$ cm$^{-2}$), and 110 keV ($1 \times 10^{12}$ cm$^{-2}$). The regions 5 electrically insulated by the implantation are shaded in FIG. 7. The region under the cap 4 is intended for the component, and its electrical properties are not influenced by the implantation.

If the planar semiconductor arrangement is to have especially high thermal stability for special applications, e.g., for a subsequent epitaxial overgrowth process for the purpose of depositing additional layers for the monolithic integration of additive components, the region to be insulated is advantageously implanted with oxygen ions of a high overall dose in the range of $2 \times 10^{15}$ cm$^{-2}$, at energies of up to a maximum of 440 keV for the exemplary embodiment of d2+d3=0.7 µm, e.g., 440 keV ($9 \times 10^{14}$ cm$^{-2}$), 210 keV ($7 \times 10^{14}$ cm$^{-2}$), and 100 keV ($2 \times 10^{14}$ cm$^{-2}$). A healing step is subsequently to be carried out at temperatures in the range of 700° C., and the semiconductor surface is advantageously covered during this process step by a dielectric layer, e.g., with SiON, in order to prevent the degradation of the surface. It has been known from H. Müssig, H. Brugger, and A. Forchel: Proceedings of the 20th International Symposium on Gallium Arsenide and Related Compounds, Freiburg (Germany), Aug. 29 to Sep. 2, 1993, that the insulating effect takes place in this case due to a chemically induced compensation of the charge carriers, with the advantage that the insulating effect remains stable up to high temperatures, especially up to the usual epitaxial temperatures.

Figure 8:
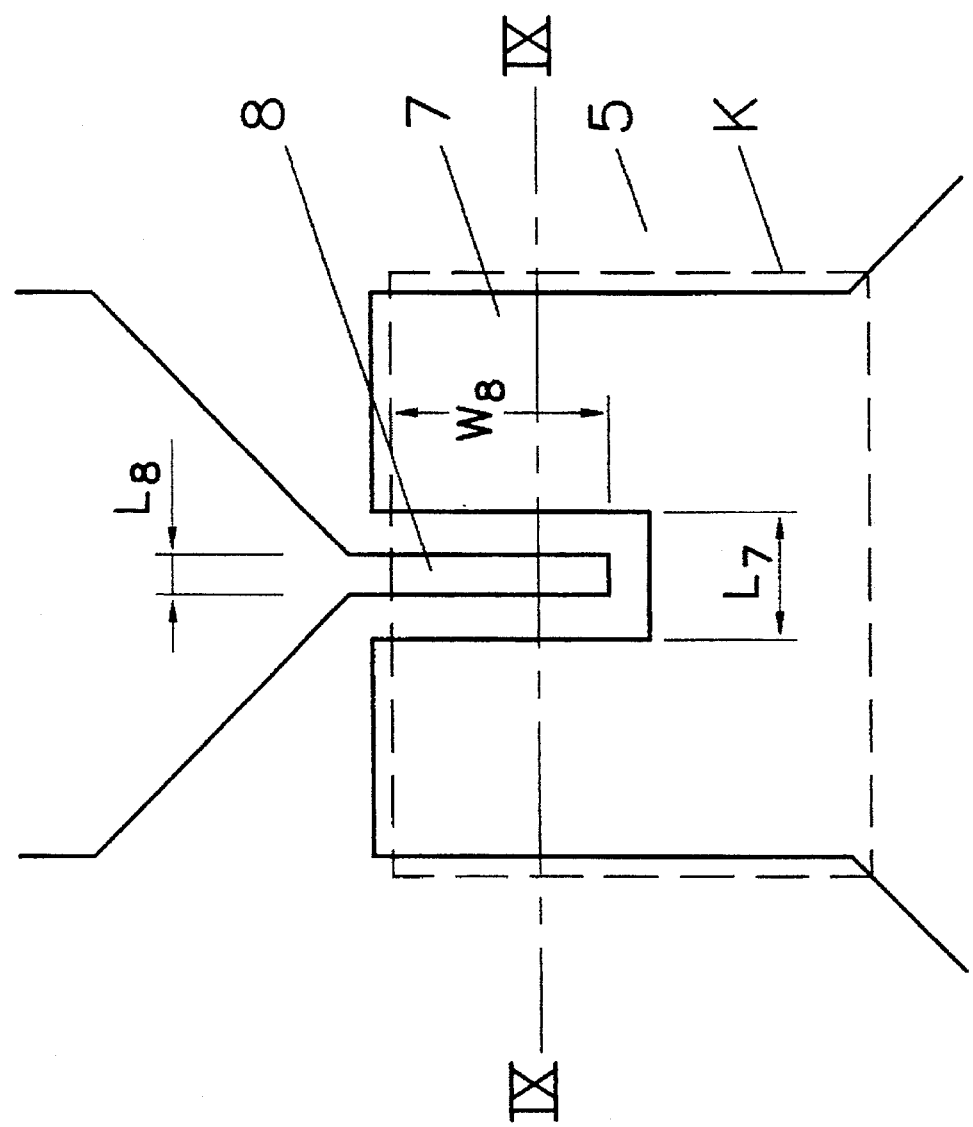
FIG. 8 is a schematic view showing the contact metalization and the lateral arrangement of the component according to the invention.
Figure 9:
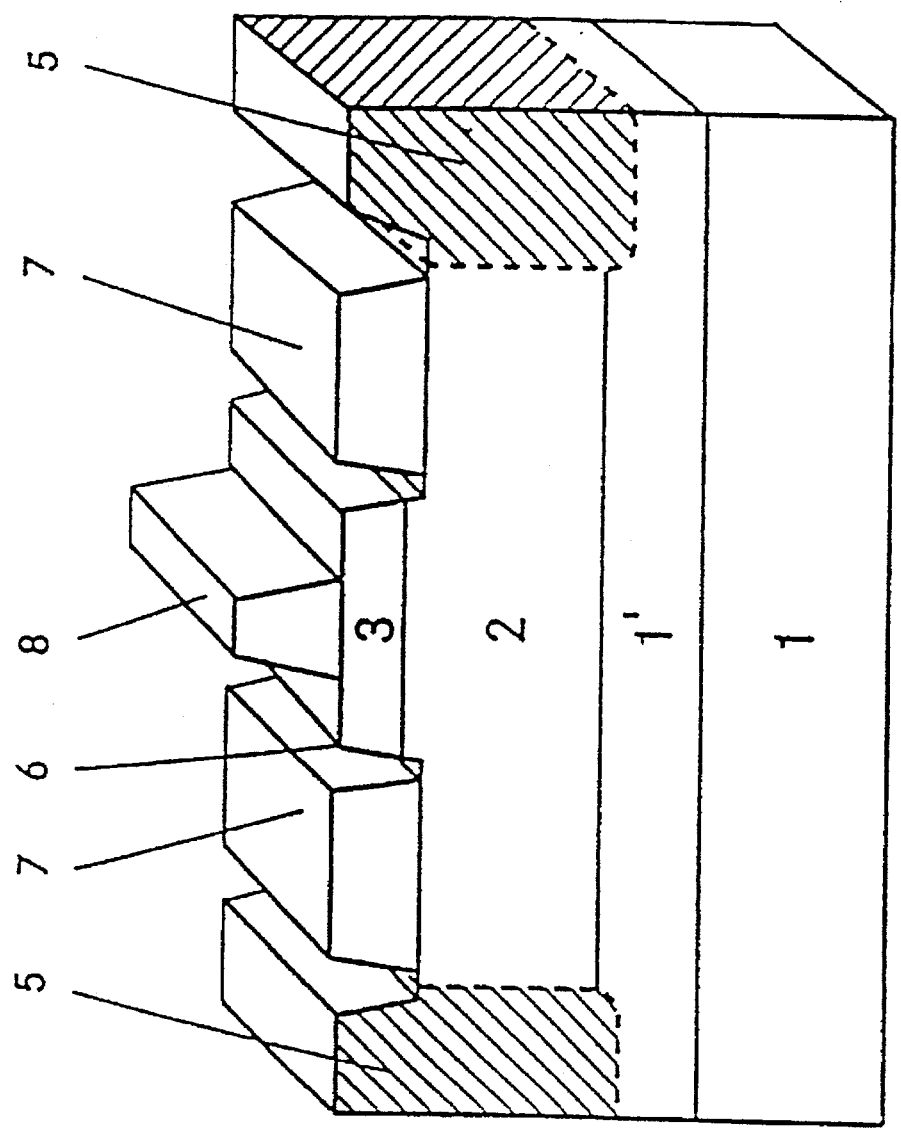
FIG. 9 is a schematic perspective view corresponding to a section along line IX–IX in FIG. 8.

The arrangement of the contact metalization and the lateral arrangement of the component are shown in FIG. 8. The area K, which appears as a nearly quadratic area and is drawn in broken lines, characterizes the region covered by the cap during the implantation between the insulated area (outside) and the component region (inside). The Schottky metal contact 8 is advantageously designed as a finger, and it consists of, e.g., a well-known Pt/Ti/Au layer sequence. The effective, current-carrying surface is defined by the finger width W8 and the finger length L8. The electrically active width W8 is defined by the end of the metalization on the front side and by the implantation boundary (represented by the broken line) on the rear side. The ohmic contact area 7 is preferably arranged in a U-shaped pattern around the Schottky metal contact 8 with a spacer opening L7, and it consists of, e.g., a well-known Ge/Ni/Au alloy. The advantageous vertical arrangement of the component according to the present invention is shown in FIG. 9 as a perspective view. The figure corresponds to it section along IX-IX in FIG. 8. It is important in this connection that the Schottky metal contact 8 is located on the epitaxial surface, which experience has shown to be of high quality. It is also advantageous that the ohmic metal contacts 7 are located directly on the low-ohmic (<10 Ω/sq) lead layer 2. To prepare the ohmic contactarea 7, corresponding openings are prepared by means of a photolithographic process and an etching process within the non-implanted component region K (cf. FIG. 8), and the ohmic contacts are applied. These are lowered by at least the depletion zone length d3, which is typically 50 nm to 100 nm in this exemplary embodiment, in relation to the epitaxial surface and to the Schottky metal contact. This slight difference in height is completely non-critical for the lithographic structuring process. The mesa structure 6 is advantageously formed at the same time, during this structuring process. The shaded areas 5 in FIG. 9 indicate the areas outside the component region, which are insulating due to implantation (cf. FIG. 7). Measurements have revealed that the specific insulating resistance values that can be reached with this implantation process in GaAs areas which were previously n-doped up to $10^{19}$ cm$^{-3}$ and have a thickness of typically 0.4 µm to 0.8 µm exceed $10^{17}$ Ωcm. This corresponds at least to the values specified for commercially available, semi-insulating GaAs semiconductor disks and are preferably used in the millimeter-wave technique. The metalization lines outside the component area K are therefore located, with especially low HF losses, on the high resistive epitaxial layers prepared by means of insulation implantation.

Figure 10:
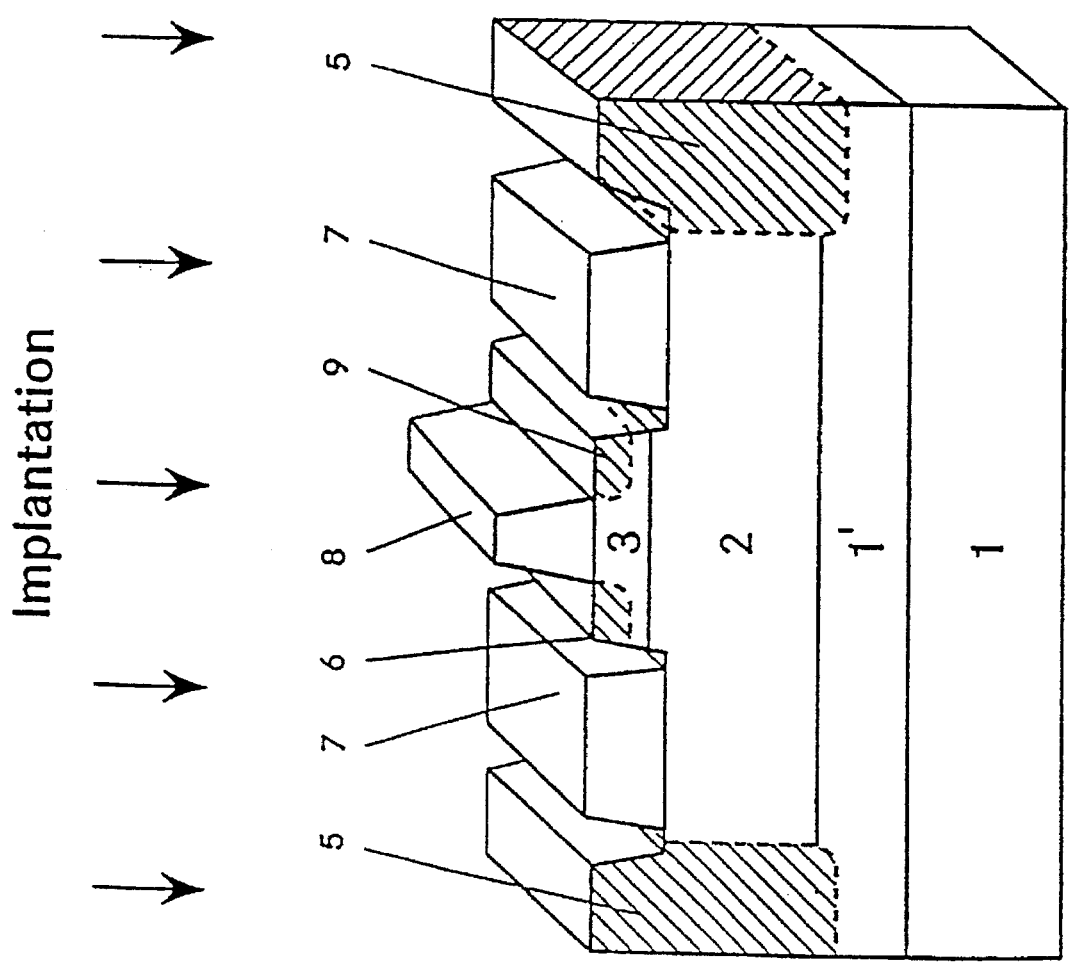
FIG. 10 is a schematic perspective view showing another embodiment according to the invention.

The arrangement according to the present invention makes it possible to prepare components with very low parasitic capacitances of less than 3 fF, as was demonstrated, e.g., by measurements on structures with Schottky metal contacts 8 with W8×L8=5 µm×2 µm and with ohmic contact clearances L7 of 5 µm via HF transmission measurements and by fitting to the stray parameter curves. In addition, the arrangement according to the present invention guarantees an advantageous minimization of the bulk resistance components, which substantially contribute to the series resistance. Furthermore, the breakdown characteristic in the inverse direction is favorable. Another, advantageous and easy-to-prepare embodiment of the arrangement according to FIG. 9 is shown in FIG. 10. An insulating region 9 can be prepared in a simple manner in the mesa structure between the Schottky metal contact 8 and the ohmic contacts 7 in the finished component structure without any masking by a soft implantation with boron or oxygen ions of a low dose and low energy, e.g., 30 keV. Advantageous current flow is generated as a result under the Schottky metal contact, and possible leakage currents on the mesa surface are reduced. To protect the component arrangement from environmental effects, the finished structure can finally be passivated, e.g., with prior-art dielectric coatings.

Figure 11:
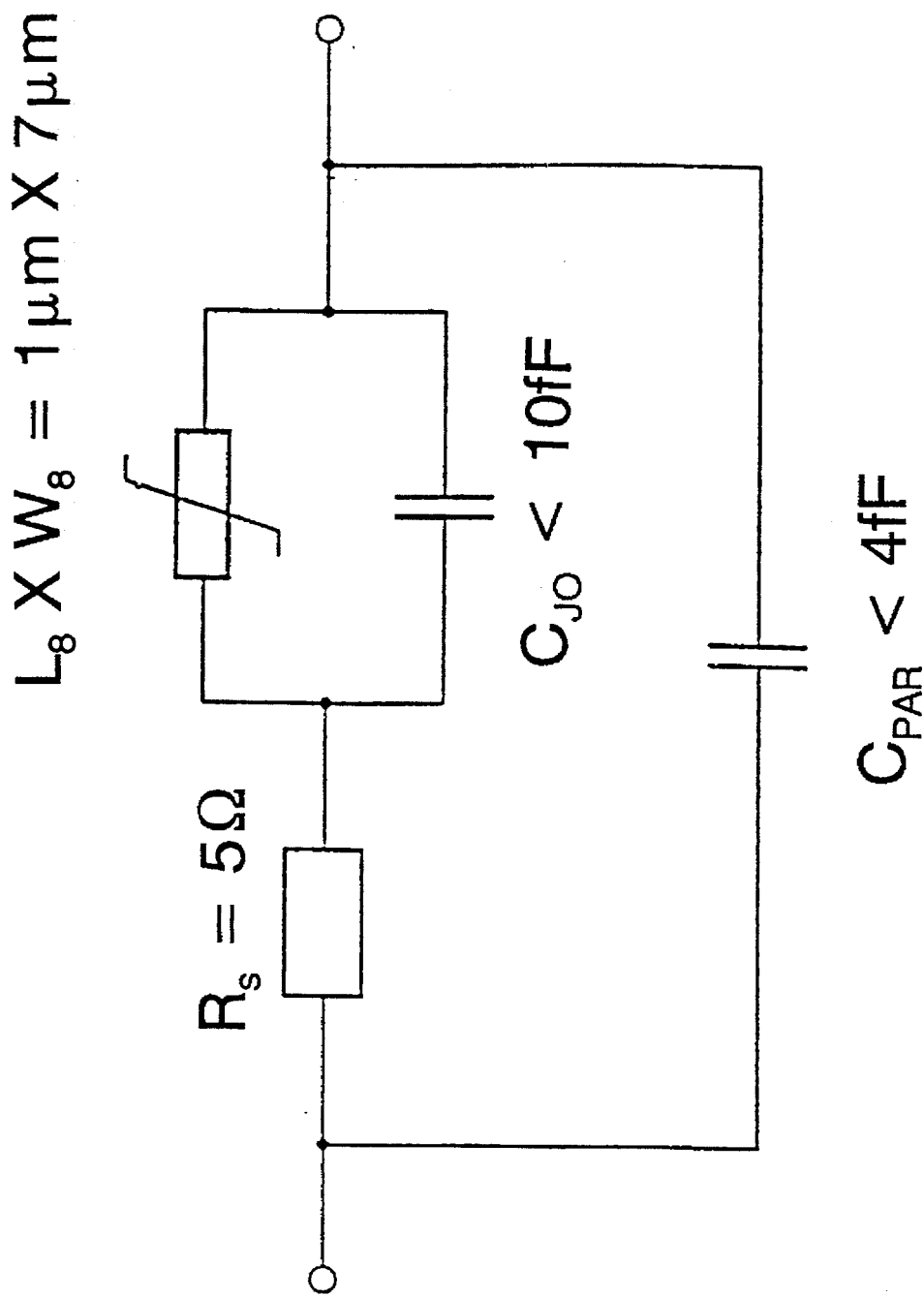
FIG. 11 is a circuit diagram illustrating typically attainable values for an exemplary Schottky contact geometry of 1 µm×7 µm.
Figure 12:
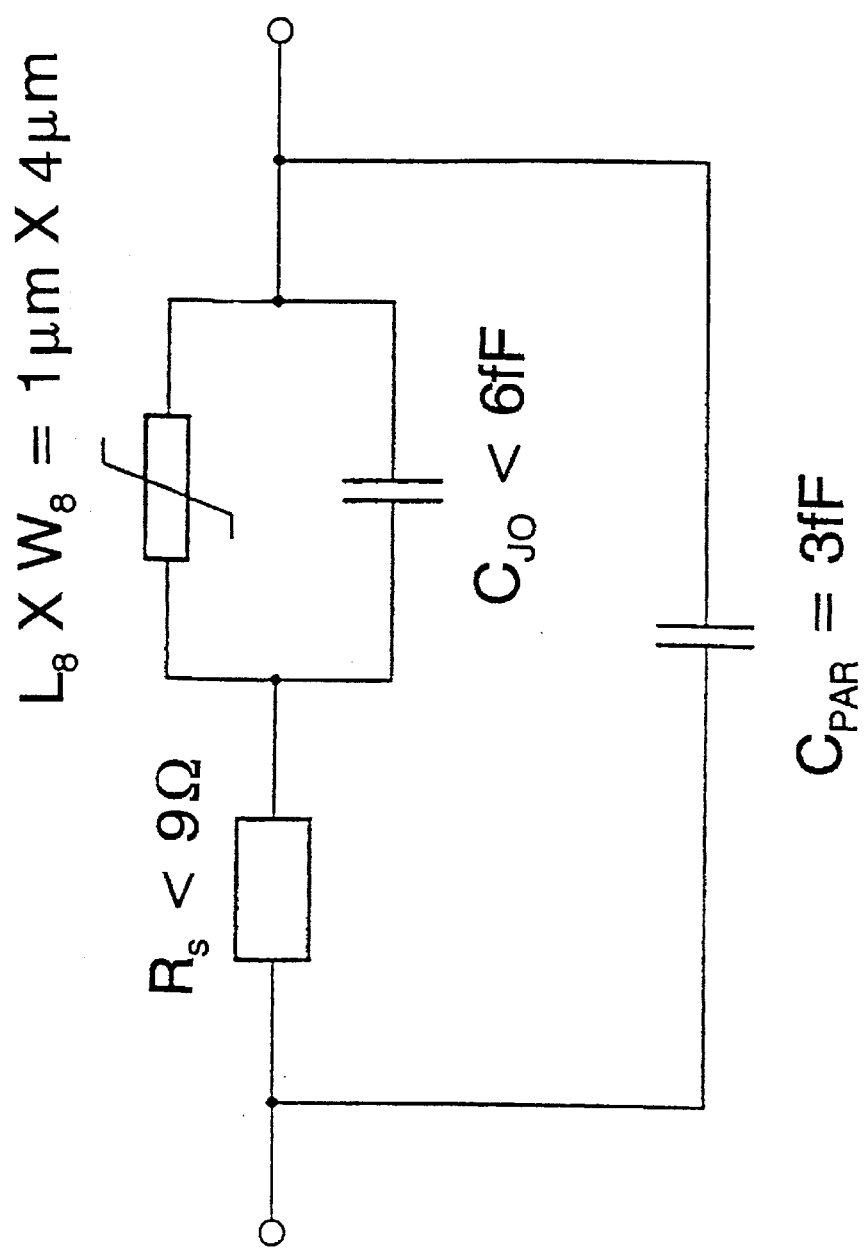
FIG. 12 is a view similar to FIG. 11 showing different values by correspondingly shortening the Schottky metal contact.

The arrangement according to the present invention makes it possible to prepare metal-semiconductor diodes characterized by advantageous, low equivalent circuit variables for millimeter-wave applications. FIG. 11 shows typically attainable values for Rs, CjO and Cpar for an exemplary Schottky contact geometry of 1 µm×7 µm. Such structure sizes can still be prepared according to light-optical lithographic processes. It is possible to prepare metal-semiconductor diodes with "cutoff" frequencies fco in the range of 2 THz to 3 THz with the arrangement according to the present invention and the advantageous manufacturing process. Structure sizes of 0.5 µm can be reached without problems by using a stepper technology. Even higher fco values can thus be reached. Depending on the intended use, e.g., for detectors, a lower capacitance may be more advantageous than an extremely low series resistance. As is shown in FIG. 12, markedly lower CjO values can be reached by correspondingly shortening the Schottky metal contact.

Figure 13:
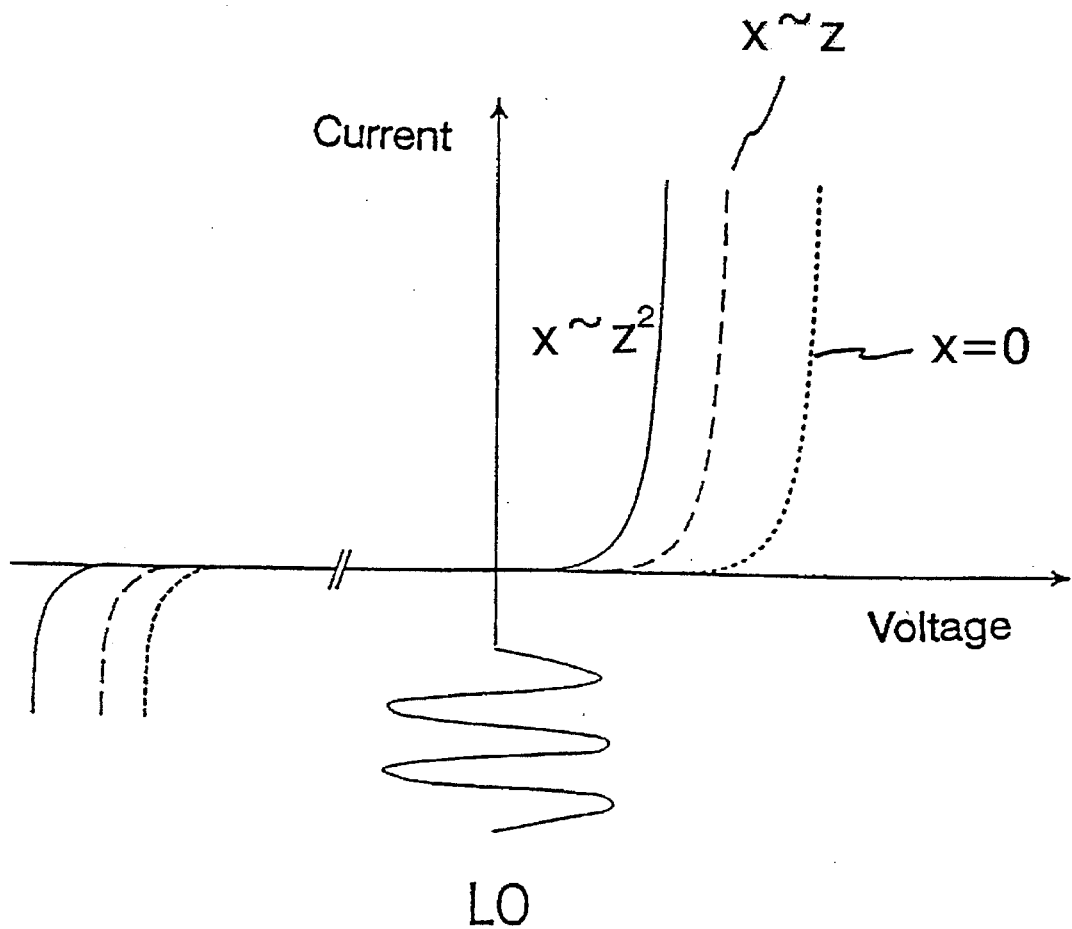
FIG. 13 is a diagram showing the cut-off voltage reduced by layer structures according to the present invention with non-linear increasing In concentration in the depletion zone.

As is summarily shown once again in FIG. 13, the cutoff voltage can be reduced especially effectively, especially for mixer applications, by the layer structure according to the present invention with nonlinearly increasing In concentration in the depletion zone. Together with the advantageous arrangement of the component for very low series resistance and capacitance values, this leads to mixer diodes with markedly lower power consumption compared with diodes with GaAs depletion zones. Above all, the combination of the component arrangement and the process is especially advantageous for the preparation of planar structures, because it is inexpensive and technologically simple.

The planar component arrangement according to the present invention and the process for preparing same are also applicable to other, vertically layered diode structures with buried layers to be contacted, and they are not limited to the metal-semiconductor diodes described as an example.

Furthermore, a thin (e.g., 2 nm) etching-stopping layer (e.g., AlAs or $Al_yGa_{1-y}As$) and/or a GaAs passivating layer (e.g., 10 nm) may be additionally grown on the depletion zone layer to protect its surface during the subsequent process steps. These additional layers can then be again removed according to prior-art selective etching techniques, at least in their surface areas, prior to the application of the contact metalizations.

While specific embodiments of the invention have been shown and described in detail to illustrate the application the principles of the invention, it will be understood that the invention may be embodied otherwise without departing from such principles.

I claim:

1. A metal-semiconductor diode, comprising:

a depletion zone from deformed $In_xGa_{1-x}As$;

a metal contact on said depletion zone, said depletion zone having an indium content (x) which continuously increases in the direction of the metal contact.

2. A diode in accordance with claim 1, wherein said indium content (x) which continuously increases comprises a change in the indium content following a higher-order function.

3. A diode in accordance with claim 2, wherein said depletion zone is grown on a high-doped GaAs lead layer in a lattice-adapted manner.

4. Diode in accordance with claim 2, wherein said depletion zone layer has a doping profile with a locus-dependent concentration course.

5. A diode in accordance with claim 1, wherein said depletion zone is grown on a high-doped GaAs lead layer in a lattice-adapted manner.

6. Diode in accordance with claim 5, wherein said depletion zone layer has a doping profile with a locus-dependent concentration course.

7. Diode in accordance with claim 1, wherein said depletion zone layer has a doping profile with a locus-dependent concentration course.

8. A metal-semiconductor diode in planar arrangement, comprising:

a high-doped lead layer;

a depletion zone layer deposited on said lead layer;

insulation regions of semiconductor material surrounding the diode and extending through said lead layer and said depletion zone layer;

a metal contact arranged on a surface of said depletion layer; and openings with connection contacts extending through the depletion zone layer into the lead layer.

9. A diode in accordance with claim 8, wherein insulation regions are provided laterally with respect to said metal contact at a boundary between the depletion layer and said openings.

10. A process for preparing a metal-semiconductor diode with a depletion zone from deformed $In_xGa_{1-x}As$, and a metal contact on said depletion zone, said depletion zone having an indium content (x) which continuously increases in the direction of the metal contact, the process comprising the steps of:

growing said $In_xGa_{1-x}As$ depletion zone layer on a high-doped lead layer in a uniform epitaxial step with the indium content increasing over the course of time.

11. A process in accordance with claim 10, wherein: newly grown depletion zone has a higher said indium content than previously grown depletion zone.

12. A process for preparing a metal-semiconductor diode with a high-doped lead layer, a depletion zone layer on said lead layer, insulation regions surrounding the diode and extending through said lead layer and said depletion zone layer, a metal contact arranged on a surface of said depletion layer, and openings with connection contacts extending through the depletion zone layer into the lead layer, the process comprising the steps of:

growing said depletion zone layer on a high-doped said lead layer;

forming insulation regions surrounding an intended diode area through said depletion zone layer and said lead layer by means of an implantation process;

forming said diode-metal contact on said depletion zone layer in said intended diode area and preparing leads via said insulation regions; and preparing channels for contacting said lead layer through said depletion zone layer in said intended diode area.

13. A process in accordance with claim 12, wherein said insulation regions surrounding the diode-metal contact are prepared in said depletion zone layer by using said diode-metal contact by means of an implantation process.

14. Process in accordance with claim 13, wherein an etching stopping layer or a passivating layer is additionally deposited on said depletion zone layer.

15. Process in accordance with claim 12, wherein an etching stopping layer or a passivating layer is additionally deposited on said depletion zone layer.

* * * * *